(12) United States Patent
Koizumi et al.

(10) Patent No.: US 10,923,369 B2
(45) Date of Patent: Feb. 16, 2021

(54) TEMPERATURE CONTROLLING APPARATUS, TEMPERATURE CONTROLLING METHOD, AND PLACING TABLE

(71) Applicant: TOKYO ELECTRON LIMITED, Tokyo (JP)

(72) Inventors: Katsuyuki Koizumi, Miyagi (JP); Kengo Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 427 days.

(21) Appl. No.: 15/718,229

(22) Filed: Sep. 28, 2017

(65) Prior Publication Data

US 2018/0102267 A1   Apr. 12, 2018

(30) Foreign Application Priority Data

Oct. 11, 2016   (JP) .............................. JP2016-199843

(51) Int. Cl.
*H01L 21/67*   (2006.01)
*H01J 37/32*   (2006.01)
(Continued)

(52) U.S. Cl.
CPC .. *H01L 21/67248* (2013.01); *H01J 37/32724* (2013.01); *H01L 21/67103* (2013.01);
(Continued)

(58) Field of Classification Search
None
See application file for complete search history.

(56) References Cited

U.S. PATENT DOCUMENTS 5,591,269 A * 1/1997 Arami ................. C23C 16/4586
118/723 R
6,008,549 A * 12/1999 Cooper ................. H02M 1/088
307/125

(Continued)

FOREIGN PATENT DOCUMENTS

JP    H11-354527 A    12/1999
JP    2005-197161 A   7/2005
(Continued)

OTHER PUBLICATIONS

Robert L. Boylestad, Introductory Circuit Anaysis, 1997, Prentice-Hall, Inc, ISBN: 0-13-235904-9, pp. 159-160, 1997.*

(Continued)

*Primary Examiner* — Ibrahime A Abraham
*Assistant Examiner* — Gyounghyun Bae
(74) *Attorney, Agent, or Firm* — Rothwell, Figg, Ernst & Manbeck, P.C.

(57) ABSTRACT

Provided is a temperature controlling apparatus in which the accuracy of the temperature control of a processing target substrate is maintained high even when heaters are disconnected. The temperature controlling apparatus includes an electronic chuck, a plurality of heaters, and a controller. The heaters are embedded inside the electrostatic chuck in each divided region and connected to each other in parallel. The controller determines, for each divided region, whether a part of the heaters embedded in the divided region is disconnected, based on a total value of currents flowing through the heaters embedded in the divided region. When it is determined that a part of the heaters embedded in the divided region is disconnected, the controller controls a current flowing through each heater embedded in the divided region where a part of the heaters is disconnected to become (Continued)

larger than a current flowing through each heater when none of the heaters is disconnected.

16 Claims, 5 Drawing Sheets

(51) Int. Cl.
  *H01L 21/683*    (2006.01)
  *H05B 1/02*    (2006.01)
  *H05B 3/28*    (2006.01)

(52) U.S. Cl.
  CPC ....... *H01L 21/6833* (2013.01); *H05B 1/0233* (2013.01); *H05B 3/28* (2013.01); *H01J 2237/2001* (2013.01)

(56) References Cited

U.S. PATENT DOCUMENTS

| | | | | |
|---|---|---|---|---|
| 6,215,643 | B1* | 4/2001 | Nagasaki | H01L 21/6833 279/128 |
| 6,676,804 | B1* | 1/2004 | Koshimizu | H01J 37/32642 156/345.53 |
| 7,115,839 | B2* | 10/2006 | Goto | H01L 21/67103 219/444.1 |
| 7,417,206 | B2* | 8/2008 | Nakamura | H01L 21/67103 219/444.1 |
| 7,713,431 | B2* | 5/2010 | Ukei | C23C 16/463 216/67 |
| 8,791,392 | B2* | 7/2014 | Singh | H01L 21/67109 219/446.1 |
| 8,981,263 | B2* | 3/2015 | Sasaki | H01L 21/6831 219/444.1 |
| 9,681,497 | B2* | 6/2017 | Nangoy | H01L 21/67109 |
| 9,824,904 | B2* | 11/2017 | Benjamin | H01L 21/67069 |
| 10,079,167 | B2* | 9/2018 | Kosakai | H01L 21/67103 |
| 10,236,194 | B2* | 3/2019 | Kim | H01L 21/67109 |
| 10,237,916 | B2* | 3/2019 | Voronin | H05B 1/0233 |
| 10,354,904 | B2* | 7/2019 | Okugawa | H01L 21/67103 |
| 10,502,639 | B2* | 12/2019 | Kosakai | H01L 21/67248 |
| 2004/0261946 | A1* | 12/2004 | Endoh | H01J 37/32082 156/345.15 |
| 2008/0257495 | A1* | 10/2008 | Tadokoro | G03F 7/70483 156/345.27 |
| 2010/0071850 | A1* | 3/2010 | Himori | H01J 37/32091 156/345.44 |

FOREIGN PATENT DOCUMENTS

| | | |
|---|---|---|
| JP | 2016-6875 A | 1/2016 |
| JP | 2016-100473 A | 5/2016 |
| JP | 2016-165006 A | 9/2016 |

OTHER PUBLICATIONS

Office Action issued for corresponding Japanese Patent Application No. 2016-199843, dated Jul. 21, 2020 (10 pages).

* cited by examiner

TEMPERATURE CONTROLLING APPARATUS, TEMPERATURE CONTROLLING METHOD, AND PLACING TABLE

CROSS-REFERENCE TO RELATED APPLICATIONS

This application is based on and claims priority from Japanese Patent Application No. 2016-199843, filed on Oct. 11, 2016, with the Japan Patent Office, the disclosure of which is incorporated herein in its entirety by reference.

TECHNICAL FIELD

Various aspects and exemplary embodiments disclosed herein relate to a temperature controlling apparatus, a temperature controlling method, and a placing table.

BACKGROUND

In a semiconductor manufacturing process, the temperature of a semiconductor wafer as a processing target substrate is one of important factors that affect the characteristics of the semiconductor. Thus, in the manufacturing process, it is demanded to control the temperature of the semiconductor wafer with high accuracy. In order to implement the control, for example, it is taken into account to divide a placing table on which a semiconductor wafer is placed into a plurality of regions and provide an independently controllable heater in each of the divided regions.

Further, in the manufacturing process, a local unevenness of the temperature distribution on the semiconductor wafer may occur due to, for example, a temperature or pressure of a processing gas, distribution of a high frequency power, and flow of a processing gas. In order to suppress the unevenness of the temperature distribution, it is taken into account to divide the region of the placing table into more fine regions and independently control the temperature of each region by a heater embedded in the region.

When the number of the divided regions of the placing table increases, the area of each region decreases, and the size of the heater embedded in each region is also reduced. When the size of the heater is reduced, the heater needs be made thin in order to generate a predetermined heat amount. As a result, the risk of disconnection of the heater increases. The region of the placing table may be divided into several hundred or more regions, and when heaters in some of the regions are disconnected, the entire placing table is replaced, and thus, semiconductor manufacturing costs increase.

In order to avoid this problem, there has been known an auto-correction method in which when some heaters are disconnected, the heat amount that the disconnected heaters have to generate is complemented with the surrounding heaters of the disconnected heaters by controlling the heat amount of the surrounding heaters (see, e.g., Japanese Patent Laid-Open Publication No. 2016-006875).

SUMMARY

According to an aspect of the present disclosure, a temperature controlling apparatus includes a placing table, a plurality of heaters, and a controller. The placing table places a processing target substrate thereon. The plurality of heaters are embedded inside the placing table in each of a plurality of divided regions obtained by dividing the top surface of the placing table. The controller determines, for each of the divided regions, whether a part of the heaters embedded in the divided region is disconnected, based on a total value of currents flowing through the plurality of heaters embedded in the divided region. The plurality of heaters embedded in each of the divided regions are connected to each other in parallel. When it is determined, for each of the divided regions, that a part of the heaters embedded in the divided region is disconnected, the controller controls a current flowing through each heater embedded in the divided region where a part of the heaters is disconnected to become larger than a current flowing through each heater when none of the heaters is disconnected.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
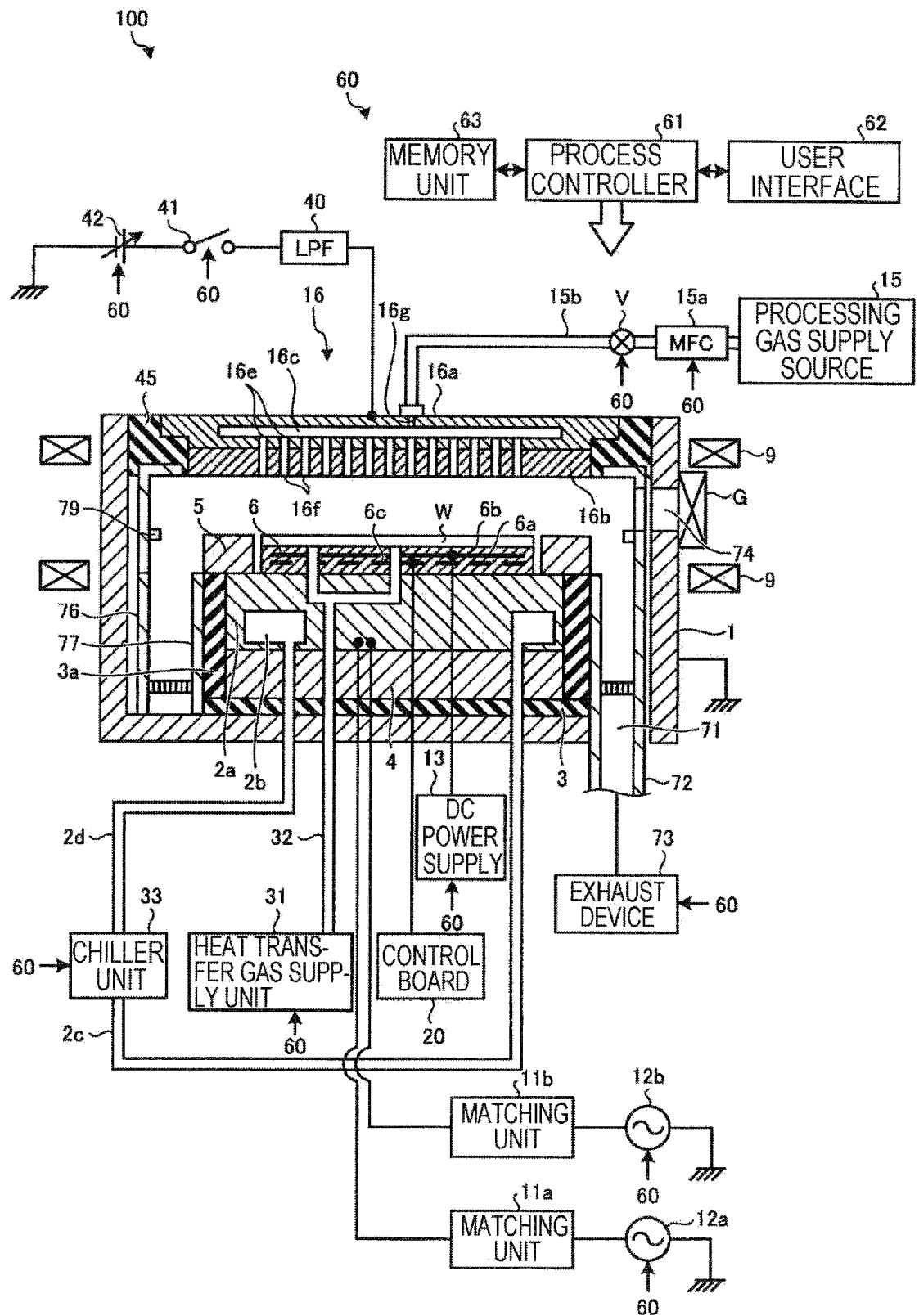
FIG. 1 is a cross-sectional view illustrating an example of a substrate processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the auto-correction method of the related art, when a disconnected heater is adjacent to a heater that is not disconnected, the heat amount that the disconnected heater has to generate may be complemented by the surrounding heater. However, when a plurality of adjacent heaters are disconnected, the disconnected heaters and the heaters that are not disconnected may not be adjacent to each other. In this case, it is difficult to complement the heat amount that the disconnected heaters have to generate, by the surrounding heaters.

In an aspect of the present disclosure, a temperature controlling apparatus includes a placing table, a plurality of heaters, and a controller. The placing table (e.g., electrostatic chuck 6) places a processing target substrate thereon. The plurality of heaters are embedded inside the placing table in each of a plurality of divided regions obtained by dividing the top surface of the placing table. The controller determines, for each of the divided regions, whether a part of the heaters embedded in the divided region is disconnected, based on a total value of currents flowing through the plurality of heaters embedded in each of the divided regions. The plurality of heaters embedded in each of the divided regions are connected to each other in parallel. When it is determined, for each of the divided regions, that a part of the heaters embedded in the divided region is disconnected, the controller controls a current flowing through each heater embedded in the divided region where a part of the heaters is disconnected to become larger than a current flowing through each heater when none of the heaters is disconnected.

In the temperature controlling apparatus, two heaters may be embedded in each of the divided regions to be connected to each other in parallel. Further, the controller may determine, for each of the divided regions, that a part of the heaters embedded in the divided region is disconnected when a total value of currents flowing through the two heaters embedded in the divided region is less than a first threshold value smaller than a total value of currents flowing through two heaters embedded in a divided region when none of the heaters is disconnected, and equal to or larger than a second threshold value smaller than the first threshold value.

In the temperature controlling apparatus, the heaters may be resistance heaters. The first threshold value may be obtained by adding a predetermined margin to a value of ½ times the total value of the currents flowing through the two heaters embedded in the divided region when none of the heaters is disconnected, and the second threshold value may be obtained by adding a predetermined margin to zero (0).

In the temperature controlling apparatus, when it is determined, for each of the divided regions, that a part of the heaters embedded in the divided region is disconnected, the controller controls the current flowing through each heater embedded in the divided region where a part of the heaters is disconnected to become $\sqrt{2}$ times the current flowing through each heater when none of the heaters is disconnected.

In the temperature controlling apparatus, the placing table may include a plurality of laminated insulating layers, and the plurality of heaters embedded in each of the divided regions may be disposed on different surfaces of one of the plurality of insulating layers, respectively.

In the temperature controlling apparatus, the placing table may include a plurality of laminated insulating layers, and the plurality of heaters embedded in each of the divided regions may be disposed on the same surface of one of the plurality of insulating layers.

In another aspect of the present disclosure, a temperature controlling method for controlling a temperature of a processing target substrate placed on a placing table includes: measuring a total value of currents flowing through a plurality of heaters embedded inside the placing table in each of a plurality of divided regions obtained by dividing a top surface of the placing table and connected to each other in parallel, for each of the divided regions; determining, for each of the divided regions, whether a part of the heaters embedded in the divided region is disconnected, based on the total value of the currents in the divided region; and when it is determined, for each of the divided regions, that a part of the heaters embedded in the divided region is disconnected, controlling a current flowing through each heater embedded in the divided region where a part of the heaters is disconnected to become larger than a current flowing through each heater when none of the heaters is disconnected.

In still another aspect of the present disclosure, a placing table configured to place a processing target substrate thereon includes a plurality of heaters embedded inside the placing table in each of a plurality of divided regions obtained by dividing a top surface of the placing table, and the plurality of heaters embedded in each of the divided regions are connected to each other in parallel.

According to the various aspects and exemplary embodiments of the present disclosure, even when heaters are disconnected, the accuracy of the temperature control of a processing target substrate may be maintained high.

Hereinafter, exemplary embodiments of the temperature controlling apparatus, the temperature controlling method, and the placing table of the present disclosure will be described in detail based on the accompanying drawings. The temperature controlling apparatus, the temperature controlling method, and the placing table of the present disclosure are not limited by the exemplary embodiments.

Exemplary Embodiments

[Configuration of Substrate Processing Apparatus 100]

FIG. 1 is a cross-sectional view illustrating an example of a substrate processing apparatus 100. As illustrated in FIG. 1, for example, the substrate processing apparatus 100 includes a chamber 1 that is airtightly configured and electrically grounded. The chamber 1 is made of, for example, aluminum having the surface covered with an anodized film, and formed in a substantially cylindrical shape. In the present exemplary embodiment, the substrate processing apparatus 100 is a capacitively coupled parallel flat plate plasma processing apparatus.

A base table 2a formed of a conductive metal such as, for example, aluminum is provided inside the chamber 1. The base table 2a has the function of a lower electrode. The base table 2a is supported on a conductor supporting table 4 provided on an insulating plate 3. A focus ring 5 formed of, for example, single-crystal silicon is provided on the top outer periphery of the base table 2a. A cylindrical inner wall member 3a made of, for example, quartz is provided around the base table 2a and the supporting table 4 to surround the base table 2a and the supporting table 4.

A shower head 16 having the function of an upper electrode is provided above the base table 2a to face the base table 2a substantially in parallel, in other words, to face a semiconductor wafer W placed on the base table 2a. The shower head 16 and the base table 2a function as a pair of electrodes (upper and lower electrodes). A high frequency power supply 12a is connected to the base table 2a via a matching unit 11a. Further, a high frequency power supply 12b is connected to the base table 2a via a matching unit 11b.

The high frequency power supply 12a supplies, to the base table 2a, a high frequency power of a predetermined frequency (e.g., 100 MHz) used for, for example, plasma generation. The high frequency power supply 12b supplies, to the base table 12a, a high frequency power of a lower frequency (e.g., 13 MHz) than that of the high frequency power supply 12a, as a high frequency power of a predetermined frequency used for, for example, ion attraction (bias). For example, the on/off state of the high frequency power supplies 12a and 12b and the high frequency powers supplied by the high frequency power supplies 12a and 12b are controlled by a control device 60 to be described later.

An electrostatic chuck 6 is provided on the top surface of the base table 2a to attract and hold the semiconductor wafer W as an example of a processing target substrate, and control the temperature of the semiconductor wafer W. The electrostatic chuck or placing table 6 includes a plurality of laminated insulating layers 6b, an electrode 6a provided between the insulating layers 6b, and a plurality of heaters 6c. The electrode 6a is connected to a DC power supply 13. The heaters 6c are connected to a control board 20 to be described later. The electrode 6a generates the Coulomb force on the surface of the electrostatic chuck 6 by a DC voltage applied from the DC power supply 13, and attracts and holds the semiconductor wafer W on the top surface of the electrostatic chuck 6 by the Coulomb force. The on/off state of the DC power supply 13 is controlled by the control device 60 to be described later.

Further, the electrostatic chuck 6 heats the semiconductor wafer W by heat generated by the heaters 6c. The top surface of the electrostatic chuck 6 is divided into a plurality of regions, and the plurality of heaters 6c are embedded in each of the divided regions. In the present exemplary embodiment, two heaters 6c are embedded in each of the divided regions. In the present exemplary embodiment, the electrostatic chuck 6 is an example of the placing table.

A flow path 2b is formed inside the base table 2a to allow a coolant such as, for example, galden to flow therethrough, and a chiller unit 33 is connected to the flow path 2b via pipes 2c and 2d. The coolant supplied from the chiller unit 33 circulates in the flow path 2b so that the base table 2a is cooled by heat exchange with the coolant. For example, the temperature and the flow rate of the coolant supplied by the chiller unit 33 are controlled by the control device 60 to be described later.

Further, a pipe 32 is provided in the base table 2a to pass through the base table 2a and supply a heat transfer gas (a backside gas) such as, for example, helium gas to the rear surface side of the semiconductor wafer W. The pipe 32 is connected to a heat transfer gas supply unit 31. For example, the flow rate of the heat transfer gas supplied to the rear surface side of the semiconductor wafer W from the heat transfer gas supply unit 31 through the pipe 32 is controlled by the control device 60 to be described later.

The control device 60 may control the temperature of the semiconductor wafer W attracted and held on the top surface of the electrostatic chuck 6 to be a temperature within a predetermined range, by controlling the temperature of the coolant flowing through the flow path 2b, the power supplied to each of the heaters 6c inside the electrostatic chuck 6, and the flow rate of the heat transfer gas supplied to the rear surface of the semiconductor wafer W.

The shower head 16 is provided at the upper portion of the chamber 1. The shower head 16 includes a main body 16a and a top ceiling plate 16b forming an electrode plate, and is supported on the upper portion of the chamber 1 via an insulating member 45. The main body 16a is made of, for example, aluminum having the anodized surface, and the lower portion thereof detachably supports the top ceiling plate 16b. The top ceiling plate 16b is formed of, for example, a silicon-containing material such as, for example, quartz.

A gas diffusion chamber 16c is provided inside the main body 16a. A plurality of gas outlets 16e are formed on the bottom portion of the main body 16a to be positioned below the gas diffusion chamber 16c. A plurality of gas inlets 16f are provided in the top ceiling plate 16b to penetrate the top ceiling plate 16b in the thickness direction of the top ceiling plate 16b, and communicate with the above-described gas flow outlets 16e, respectively. By this configuration, a processing gas supplied to the gas diffusion chamber 16c is diffused and supplied in the shower form into the chamber 1 through the gas outlets 16e and the gas inlets 16f. Further, a temperature regulator such as, for example, a heater (not illustrated) or a pipe for circulating the coolant (not illustrated) is provided in, for example, the main body 16a so that the shower head 16 may be controlled to have a temperature within a desired range during the processing of the semiconductor wafer W.

A gas inlet 16g is formed in the main body 16a to introduce a processing gas into the gas diffusion chamber 16c. One end of a pipe 15b is connected to the gas inlet 16g, and a processing gas supply source 15 is connected to the other end of the pipe 15b via a valve V and a mass flow controller (MFC) 15a to supply a processing gas used for the processing of the semiconductor wafer W. The processing gas supplied from the processing gas supply source 15 is supplied to the gas diffusion chamber 16c through the pipe 15b, and diffused and supplied in the shower form into the chamber 1 through the gas outlets 16e and the gas inlets 16f. The valve V and the MFC 15a are controlled by the control device 60 to be described later.

A variable DC power supply 42 is electrically connected to the shower head 16 via a low pass filter (LPF) 40 and a switch 41. The variable DC power supply 42 is configured to be able to supply and cut off a DC voltage by the switch 41. The magnitude of the DC voltage supplied to the shower head 16 from the variable DC power supply 42 or the on/off state of the switch 41 is controlled by the control device 60 to be described later. For example, when a high frequency power is supplied to the base table 2a from the high frequency power supplies 12a and 12b so as to generate plasma in the processing space inside the chamber 1, the switch 41 is turned on by the control device 60 according to necessity, and a DC voltage having a predetermined magnitude is applied to the shower head 16 functioning as an upper electrode.

An exhaust port 71 is formed on the bottom portion of the chamber 1. An exhaust device 73 is connected to the exhaust port 71 via an exhaust pipe 72. The exhaust device 73 includes a vacuum pump, and by operating the vacuum pump, the interior of the chamber 1 may be depressurized to a predetermined degree of vacuum. For example, the exhaust flow rate of the exhaust device 73 is controlled by the control device 60 to be described later. An opening 74 is provided on the side wall of the chamber 1, and a gate valve G is provided in the opening 74 to open and close the opening 74.

A deposit shield 76 is detachably provided on the inner wall of the chamber 1 along the surface of the inner wall. Further, a deposit shield 77 is provided on the outer peripheral surface of the inner wall member 3 to cover the inner wall member 3a. The deposit shields 76 and 77 suppress etching by-products (deposits) from adhering to the inner wall of the chamber 1. A conductive member (a GND block) 79 is provided at a position in the deposit shield 76 which has substantially the same height as that of the semiconductor wafer W adsorbed and held on the electrostatic chuck 6, and connected to the ground in the DC manner. An abnormal discharge in the chamber 1 is suppressed by the conductive member 79.

In addition, a ring magnet 9 is concentrically disposed around the chamber 1. The ring magnet 9 forms a magnetic field in the space between the shower head 16 and the base table 2a. The ring magnet 9 is rotatably held by a rotating mechanism (not illustrated).

The control device 60 includes a process controller 61, a user interface 62, and a memory unit 63. The user interface 62 includes, for example, an input device that receives an operation from an operator or the like of the substrate processing apparatus 100, and a display device that displays results of processes by the process controller 61 or a notification from the process controller 61. The memory unit 63 stores, for example, programs to be executed by the process controller 61 and recipes including conditions of, for example, respective processes. The process controller 61 causes the substrate processing apparatus 100 to execute predetermined processes, by executing the programs read from the memory unit 63 and controlling the respective units of the substrate processing apparatus 100 based on the recipes stored in the memory unit 63.

[Electrostatic Chuck 6]

Figure 2:
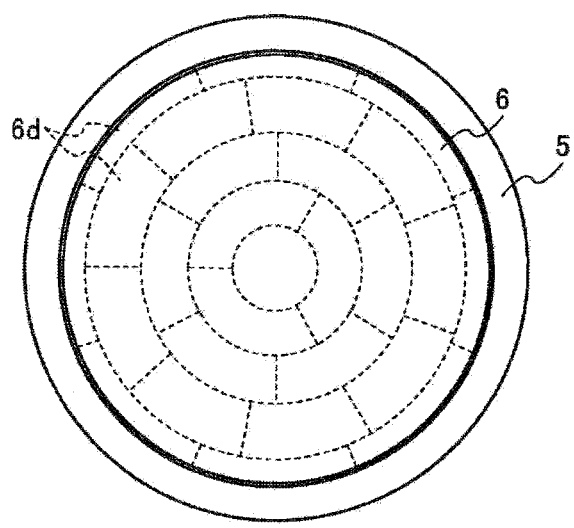
FIG. 2 is a view illustrating an example of the top surface of an electrostatic chuck.

FIG. 2 is a view illustrating an example of the top surface of the electrostatic chuck 6. The focus ring 5 is provided on the outer periphery of the electrostatic chuck 6 to surround the electrostatic chuck 6. The top surface of the electrostatic chuck 6 on which the semiconductor wafer W is placed is divided into a plurality of divided regions 6d. In the present exemplary embodiment, the divided regions 6d are obtained by concentrically dividing the top surface of the electrostatic chuck 6 into a plurality of regions, and further, circumferentially dividing each of the concentrically divided regions, excluding the central region, into a plurality of regions. In the present exemplary embodiment, as illustrated in FIG. 2, the electrostatic chuck 6 is divided into, for example, 27 divided regions 6d. However, the number of the divided regions 6d is not limited thereto, and the electrostatic chuck 6 may be divided into 100 or more divided regions 6d.

In the present exemplary embodiment, two heaters 6c are embedded in the internal portion of the electrostatic chuck 6 corresponding to each of the divided regions 6d. A power supplied to each of the heaters 6c embedded in the divided regions 6d is independently controlled by the control board 20 to be described later.

[Structure of Heater in Divided Region]

Figure 3A:
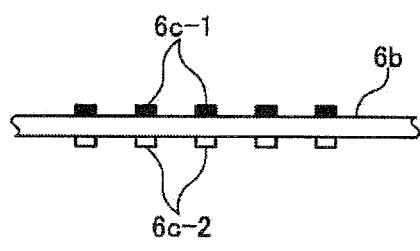
FIGS. 3A and 3B are views illustrating an exemplary structure of a heater provided in each divided region.
Figure 3B:
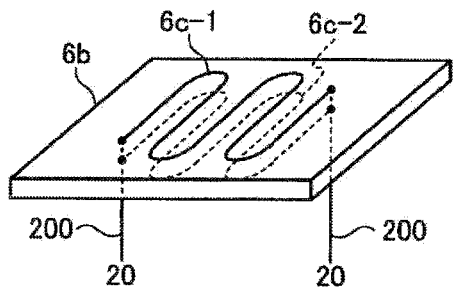

FIGS. 3A and 3B are views illustrating an exemplary structure of the heaters 6c provided in each divided region 6d. FIG. 3A is a view illustrating an example of the cross-sections of the heaters 6c provided in each divided region 6d. FIG. 3B is a perspective view illustrating an example of the heaters 6c provided in each divided region 6d. In the present exemplary embodiment, as illustrated in FIGS. 3A and 3B, for example, two heaters 6c-1 and 6c-2 are provided in each divided region 6d. In each divided region 6d, the heater 6c-1 is formed on one surface of one of the plurality of laminated insulating layers 6b, and the heater 6c-2 is formed on the other surface thereof, by printing or the like. Thus, the two heaters 6c-1 and 6c-2 may be easily formed in each divided region 6d without causing short-circuit of the two heaters 6c-1 and 6c-2. The two heaters 6c-1 and 6c-2 provided in each divided region 6d are connected to each other in parallel as illustrated in FIG. 3B, and connected to the control board 20 via wirings 200.

In the present exemplary embodiment, the heaters 6c-1 and 6c-2 are, for example, resistive heaters. In each divided region 6d, resistance values of the heaters 6c-1 and 6c-2 may be substantially equal to each other. As another example, the heaters 6c-1 and 6c-2 may be, for example, semiconductor heaters (e.g., positive temperature coefficient (PTC) thermistors) or Peltier elements.

[Configuration of Control Board 20]

Figure 4:
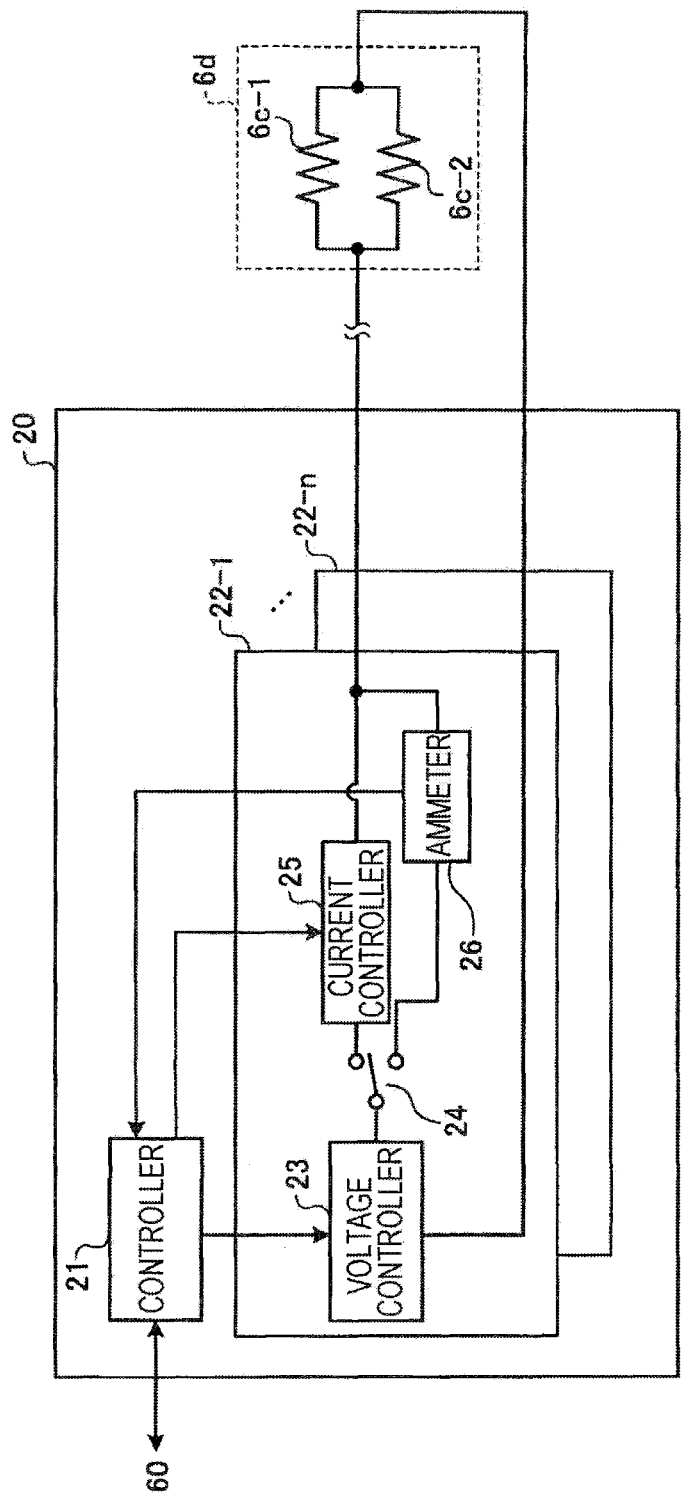
FIG. 4 is a block diagram illustrating an example of a control board.

FIG. 4 is a block diagram illustrating an example of the control board 20.

For example, as illustrated in FIG. 4, the control board 20 includes a controller 21 and a plurality of control blocks 22-1 to 22-n. Hereinbelow, the plurality of control blocks 22-1 to 22-n will be simply referred to as a "control block 22" when the plurality of control blocks 22-1 to 22-n are collectively referred without being individually discriminated. One control block 22 is provided for one divided region 6d in the electrostatic chuck 6. Each control block 22 includes a voltage controller 23, a switch 24, a current controller 25, and an ammeter 26. The substrate processing apparatus 100 including the electrostatic chuck 6, the heaters 6c embedded in each divided region 6d, and the controller 21 is an example of the temperature controlling apparatus.

The voltage controller 23 generates a power having a predetermined voltage and outputs the power to the switch 24, in response to an instruction from the controller 21. In response to an instruction from the controller 21, the switch 24 outputs, to the current controller 25 or the ammeter 26, the power output from the voltage controller 23. 26. The current controller 25 controls a total value of currents supplied to the heaters 6c in each divided region 6d to be a value instructed from the controller 21. The ammeter 26 measures the total value of the currents flowing through the heaters 6c in each divided region 6d according to the power output from the voltage controller 23, in response to an instruction from the controller 21. Then, the ammeter 26 notifies the controller 21 of information on the measured total value of the currents.

The controller 21 controls the voltage controller 23 to generate the power having the predetermined voltage and controls the switch 24 to output the power from the voltage controller 23 to the ammeter 26, for each divided region 6d at a predetermined timing such as, for example, prior to starting the processes by the substrate processing apparatus 100. Then, the controller 21 controls the ammeter 26 to measure the total value of the currents flowing through the heaters 6c in each divided region 6d.

Here, the two heaters 6c provided in each divided region 6d inside the electrostatic chuck 6 are connected to each other in parallel. Thus, when any one of the heaters 6c in each divided region 6d is disconnected, the total value of the currents flowing in the divided region 6d becomes lower than a total value of currents flowing in a divided region 6d when none of the heaters 6c is disconnected. In the present exemplary embodiment, the resistance values of the two heaters 6c provided in each divided regions 6d are substantially equal to each other. Thus, when any one of the heaters 6c in each divided region 6d is disconnected, the total value of the currents flowing in the divided region 6d becomes a value of ½ or less times the total value of the currents flowing in the divided region 6d where none of the heaters 6c is disconnected.

The controller 21 determines whether the total value of the currents measured by the ammeter 26 is equal to or larger than a first threshold value. In the present exemplary embodiment, the first threshold value is, for example, a value obtained by adding a predetermined margin to a value of ½ times the total value of the currents flowing in the divided region 6d where none of the heaters 6c is disconnected. The predetermined margin is, for example, a value predetermined based on a variation in the resistance value of each heater 6c, or a measurement error of currents measured by the ammeter 26. The first threshold value may be, for example, a value of ⅔ times the total value of the currents flowing in the divided region 6d when none of the heaters 6c is disconnected.

When it is determined that the total value of the currents measured by the ammeter 26 is less than the first threshold value, the controller 21 determines whether the total value of the currents measured by the ammeter 26 is equal to or larger than a second threshold value. In the present exemplary embodiment, the second threshold value is, for example, a value obtained by adding a predetermined margin to zero (0). The predetermined margin is, for example, a value predetermined based on, for example, a measurement error of currents measured by the ammeter 26. The second threshold value may be a value of ⅓ times the total value of the currents flowing in the divided region 6d when none of the heaters 6c is disconnected.

When it is determined that the total value of the currents measured by the ammeter 26 is less than the first threshold value and equal to or larger than the second threshold value, it is found that a part of the heaters 6c in the divided region 6d, that is, one heater 6c is disconnected. Thus, the controller 21 controls the current flowing through each heater 6c embedded in the divided region 6d where a part of the heaters is disconnected to become larger than the current flowing through each heater 6c when none of the heaters 6c is disconnected.

Specifically, the controller 21 controls the current controller 25 such that the total value of the currents supplied to the divided region 6d becomes a value of $1/\sqrt{2}$ times the total value of the currents flowing in the divided region 6d when none of the heaters 6c is disconnected. Thus, the current flowing through each heater 6c embedded in the divided region 6d where a part of the heaters 6c is disconnected becomes $\sqrt{2}$ times the current flowing through each heater 6c when none of the heaters 6c is disconnected.

As a result, the power supplied to the heater 6c that is not disconnected, in the divided region 6d where a part of the heaters 6c is disconnected, may be made substantially equal to the power supplied to the divided region 6d when none of the heaters 6c is disconnected. Thus, the heat amount generated by the heater 6c that is not disconnected, in the divided region 6d where a part of the heaters 6c is disconnected, may be made substantially equal to the heat amount generated by the heaters 6c in the divided region 6d where none of the heaters 6c is disconnected. Therefore, even when a part of the heaters 6c in each divided region 6d is disconnected, the heat amount of the disconnected heater 6c may be complemented by the heater 6c that is not disconnected in the divided region 6d. Accordingly, even when the heaters 6c are disconnected, the accuracy of the temperature control of the semiconductor wafer W may be maintained high.

When the measurement of the total value of the currents by the ammeter 26 has been completed for all the divided regions 6d, the controller 21 controls the switch 24 in each control block 22 to output the power from the voltage controller 23 to the current controller 25. As a result, the heaters 6c in each divided region 6d are supplied with the currents controlled by the current controller 25 in the corresponding control block 22. Then, the substrate processing apparatus 100 executes the processes according to the recipes in the memory unit 6.

Meanwhile, when there exists a divided region 6d where the total value of the currents measured by the ammeter 26 is less than the second threshold value, it is found that all the heaters 6c in the divided region 6d are disconnected. In this case, the controller 21 notifies the control device 60 of information on the divided region 6d where all the heaters 6c are disconnected. The control device 60 notifies the operator or the like of the substrate processing apparatus 100 of the information on the divided region 6d where all the heaters 6c are disconnected, through the user interface 62.

[Temperature Controlling Process]

Figure 5:
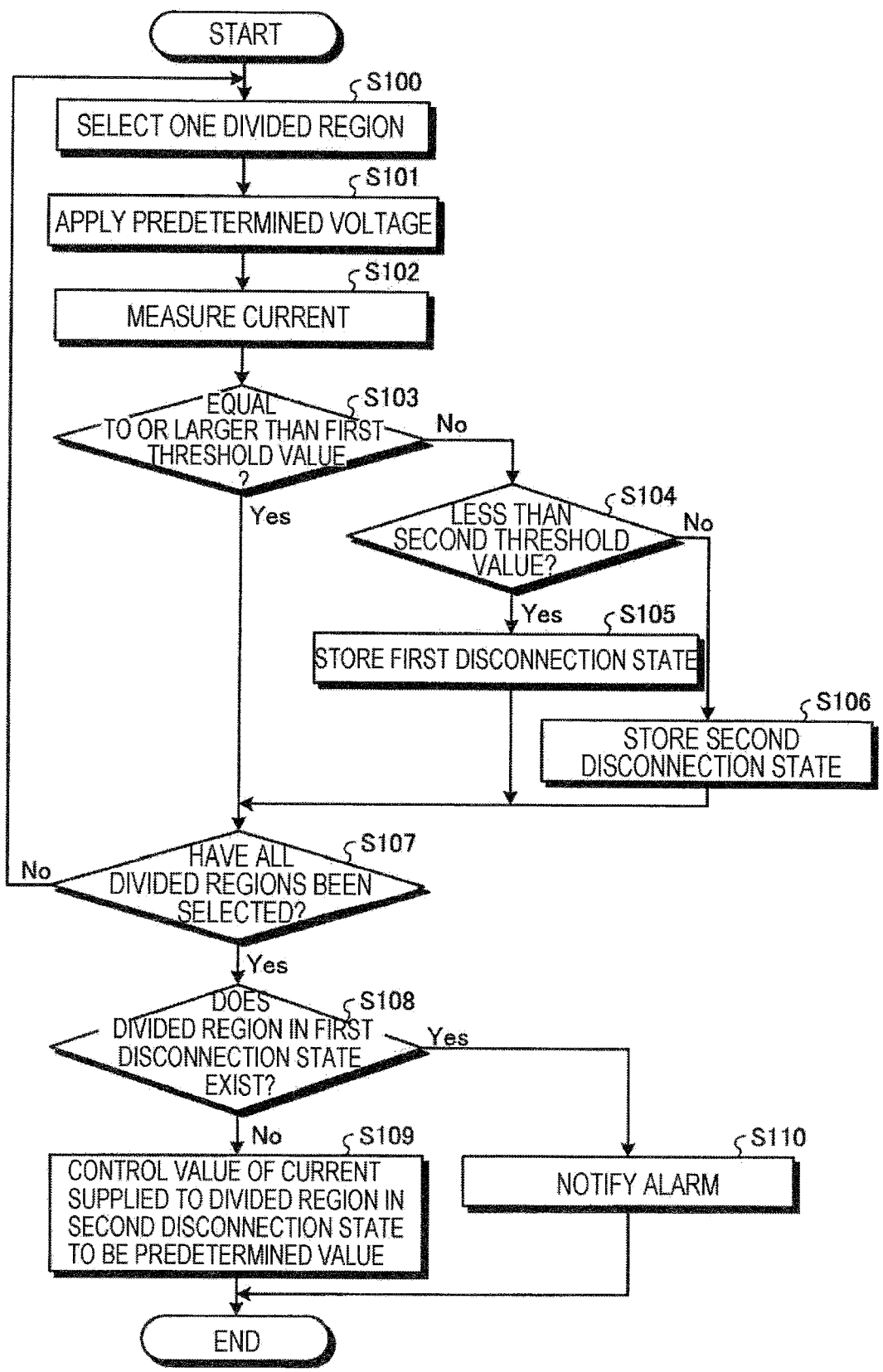
FIG. 5 is a flowchart illustrating an example of a temperature controlling process.

FIG. 5 is a flowchart illustrating an example of the temperature controlling process. The control board 20 executes the processes illustrated in the flowchart of FIG. 5 at a predetermined timing such as, for example, at the time of installing the substrate processing apparatus 100 or prior to starting the processes by the substrate processing apparatus 100.

First, the controller 21 selects one unselected divided region 6d from the plurality of divided regions 6d (S100). Then, the controller 21 controls the switch 24 such that, in the control block 22 corresponding to the divided region 6d selected in step S100, the voltage controller 23 generates power having a predetermined voltage, and the power from the voltage controller 23 is output to the ammeter 26. As a result, the predetermined voltage is applied to the heaters 6c in the divided region 6d selected in step S100 through the ammeter 26 (S101).

Next, the ammeter 26 measures the total value of the currents flowing through the heaters 6c in the divided region 6d (S102). Then, the ammeter 26 notifies the controller 21 of information indicating the measured total value of the currents. The controller 21 determines whether the total value of the currents indicated by the information notified from the ammeter 26 is equal to or larger than the first threshold value (S103).

When it is determined that the total value of the currents is equal to or larger than the first threshold value (S103: Yes), the controller 21 executes the process illustrated in step S107. Meanwhile, when it is determined that the total value of the currents is less than the first threshold value (S103: No), the controller 21 determines whether the total value of the currents is less than the second threshold value (S104). When it is determined that the total value of the currents is less than the second threshold value (S104: Yes), the controller 21 stores information indicating a first disconnection state in association with the divided region 6d selected in step S100 (S105). Then, the controller 21 executes the process illustrated in step S107. The first disconnection state indicates a state where all the heaters 6c included in the divided region 6d are disconnected.

Meanwhile, when it is determined that the total value of the currents is equal to or larger than the second threshold value (S104: No), the controller 21 stores information indicating a second disconnection state in association with the divided region 6d selected in step S100 (S106). The second disconnection state indicates a state where a part of the heaters 6c included in the divided region 6d is disconnected.

Next, the controller 21 determines whether all the divided regions 6d have been selected (S107). When it is determined that an unselected divided region 6d exists (S107: No), the controller 21 executes the process illustrated in step S100 again.

Meanwhile, when it is determined that all the divided regions 6d have been selected (S107: Yes), the controller 21 determines whether a divided region 6d in the first disconnection state exists (S108). When it is determined that a divided region 6d in the first disconnection state exists (S108: Yes), the controller 21 notifies the control device 60 of information indicating the divided region 6d in the first disconnection state as an alarm (S110). The process controller 61 of the control device 60 notifies, for example, the operator of the substrate processing apparatus 100 of the information indicating the divided region 6d in the first disconnection state as an alarm through the user interface 62. Then, the control board 20 ends the operation illustrated in the flowchart.

Meanwhile, when it is determined that a divided region 6d in the first disconnection state does not exist (S108: No), the controller 21 controls the current controller 25 such that the value of the currents supplied to the divided region 6d in the second disconnection state becomes a predetermined value (S109), and the control board 20 ends the operation illustrated in the flowchart. Specifically, the controller 21 controls the current controller 25 such that the current flowing through each heater 6c embedded in the divided region 6d in the second disconnection state becomes larger than the current flowing through each heater 6c when none of the heaters 6c is disconnected. For example, the controller 21 controls the current controller 25 such that the current supplied to the divided region 6d in the second disconnection state becomes $1/\sqrt{2}$ times the total value of the currents supplied to the divided region 6d when none of the heaters 6c is disconnected. As a result, a current of $\sqrt{2}$ times the current flowing through each heater 6c when none of the heaters 6c is disconnected flows through the heater 6c that is not disconnected, in the divided region 6d in the second disconnection state.

Here, when a current I is supplied to a divided region 6d where none of the heaters 6c is disconnected, a current of ½ times the current I flows in each of the two heaters 6c included in the divided region 6d. Thus, when the resistance value of each heater 6c is R, the power supplied to each heater 6c is R·(I/2)2, and the heat amount corresponding to the power of RI2/2 is generated in the entire divided region 6d.

Meanwhile, the divided region 6d in the second disconnection state is supplied with a current of $1/\sqrt{2}$ times the current I supplied to the divided region 6d when none of the heaters 6c is disconnected. Thus, a current of $I/\sqrt{2}$ flows through the heater 6c that is not disconnected, in the divided region 6d in the second disconnection state. As a result, the heat amount corresponding to the power of RI2/2, which is substantially equal to the heat amount generated by the heaters 6c in the divided region 6d where none of the heaters 6c is disconnected, is generated in the entire divided region 6d in the second disconnection state. As described above, even when a part of the heaters 6c in each divided region 6d is disconnected, the heat amount of the disconnected heater 6c may be complemented by the heater 6c that is not disconnected, in the divided region 6d.

An exemplary embodiment of the substrate processing apparatus 100 has been described. As apparent from the foregoing descriptions, according to the substrate processing apparatus 100 of the present exemplary embodiment, even when the heaters 6c are disconnected, the accuracy of the temperature control of the semiconductor wafer W may be maintained high.

<Others>

The present disclosure is not limited to the above-described exemplary embodiment, and may be modified in various ways within the scope of the gist of the present disclosure.

Figure 6A:
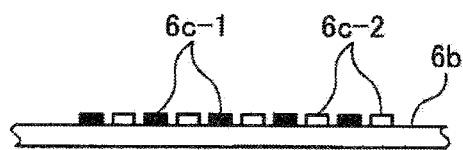
FIGS. 6A and 6B are views illustrating another exemplary structure of each heater provided in a divided region.
Figure 6B:
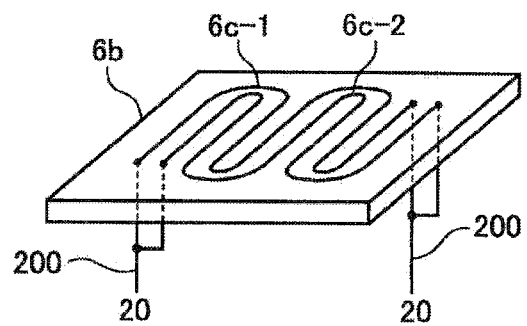

For example, in the above-described exemplary embodiment, the plurality of heaters 6c provided in each divided region 6d are formed on the different surfaces of one insulating layer 6b. However, the present disclosure is not limited thereto. For example, the plurality of heaters 6c provided in each divided region 6d may be formed on the same surface of one insulating layer 6b as illustrated in FIGS. 6A and 6B. FIGS. 6A and 6B are views illustrating another exemplary structure of the heaters 6c provided in each divided region 6d. FIG. 6A is a view illustrating an example of the cross-sections of the heaters 6c provided in each divided region 6d. FIG. 6B is a perspective view illustrating an example of the heaters 6c provided in each divided region 6d.

When the two heaters 6c-1 and 6c-2 are formed on the same surface of the insulating layer 6b as illustrated in FIGS. 6A and 6B, the distances from the respective heaters 6c to the semiconductor wafer W may be made substantially equal to each other. Thus, it is possible to reduce a difference of the heat amount applied to the semiconductor wafer W between the case where only one heater 6c in each divided region 6d generates heat and the case where only the other heater 6c in each divided region 6d generates heat. As a result, even when a part of the heaters 6c is disconnected, the accuracy of the temperature control of the semiconductor wafer W may be maintained high.

In the above-described exemplary embodiment, the two heaters 6c are provided in each divided region 6d to be connected to each other in parallel. However, as another example, three or more heaters 6c may be provided in each divided region 6d to be connected to each other in parallel.

In the above-described exemplary embodiment, the plurality of heaters 6c are provided in one of the plurality of laminated insulating layers 6b. However, the present disclosure is not limited thereto. For example, the plurality of heaters 6c may be formed on the same surface or the different surfaces of an insulating film to be connected to each other in parallel, and the film on which the heaters 6c are formed may be attached to the lower surface of the electrostatic chuck 6.

In the above-described exemplary embodiment, the substrate processing apparatus 100 is described as an example of a capacitively coupled parallel flat plate plasma processing apparatus. However, the present disclosure is not limited thereto. The technology disclosed in the above-described exemplary embodiment may also be applied to a plasma processing apparatus using, for example, an inductively coupled plasma (ICP) method or a microwave method as long as the processing apparatus processes the semiconductor wafer W and controls the temperature of the semiconductor wafer W during the processing. Further, the technology disclosed in the above-described exemplary embodiment may also be applied to an apparatus that performs a heat treatment or the like without using plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A temperature controlling apparatus comprising:
    a placing table on which a processing target substrate is placed thereon;
    a plurality of heaters embedded inside the placing table in each of a plurality of divided regions obtained by dividing a top surface of the placing table, wherein each of the plurality of heaters is one of: a resistance heater, a semiconductor heater or a Peltier element; and
    a first controller and a plurality of control blocks, wherein the first controller determines, for each of the plurality of divided regions, whether a part of the plurality of heaters embedded in a divided region is disconnected, based on a total value of currents flowing through the plurality of heaters embedded in the divided region, wherein the plurality of control blocks include a control block for each of the plurality of divided regions, and each control block includes a current controller connected to the first controller, wherein the plurality of heaters embedded in each of the plurality of divided regions are connected to each other in parallel, and in response to a determination by the first controller, for each of the plurality of divided regions, that the part of the plurality of heaters embedded in the divided region is disconnected, the current controller controls a disconnection current flowing through each heater embedded in the divided region where the part of the plurality of heaters is disconnected to become larger than a normal current flowing through each heater embedded in the divided region when none of the plurality of heaters is disconnected.

2. The temperature controlling apparatus of claim 1, wherein two heaters are embedded in each of the plurality of divided regions to be connected to each other in parallel, and the first controller determines, for each of the plurality of divided regions, that one of the two heaters embedded in the divided region is disconnected when a sub-total value of currents flowing through the two heaters embedded in the divided region is less than a first threshold value smaller than a sub-total value of currents flowing through the two heaters embedded in Hall the divided region when none of the two heaters is disconnected, and equal to or larger than a second threshold value smaller than the first threshold value.

3. The temperature controlling apparatus of claim 2, wherein the two heaters are resistance heaters, the first threshold value is obtained by adding a first predetermined margin to a value of ½ times the sub-total value of the currents flowing through the two heaters embedded in the divided region when none of the two heaters is disconnected, and the second threshold value is obtained by adding a second predetermined margin to zero (0).

4. The temperature controlling apparatus of claim 3, wherein in response to a determination by the first controller, for each of the plurality of divided regions, that one of the two heaters embedded in the divided region is disconnected, the current controller controls the current flowing through another of the two heaters, embedded in the divided region where one of the two heaters is disconnected to become √2 times the current flowing through each heater embedded in the divided region when none of the two heaters is disconnected.

5. The temperature controlling apparatus of claim 1, wherein the placing table includes a plurality of laminated insulating layers, and the plurality of heaters embedded in each of the plurality of divided regions are disposed on different surfaces of one of the plurality of laminated insulating layers, respectively.

6. The temperature controlling apparatus of claim 1, wherein the placing table includes a plurality of laminated insulating layers, and the plurality of heaters embedded in each of the plurality of divided regions are disposed on a same surface of one of the plurality of laminated insulating layers.

7. The temperature controlling apparatus of claim 1, wherein the first controller independently controls a power for each of the plurality of heaters embedded in each of the plurality of divided regions.

8. The temperature controlling apparatus of claim 1, wherein, in each of the plurality of divided regions, resistance values of the plurality of heaters are equal to each other.

9. The temperature controlling apparatus of claim 1, wherein the current controller is configured to control the total value of currents supplied to the plurality of heaters in the divided region to be a value instructed from the first controller, and wherein each of the plurality of control blocks further includes:

a voltage controller configured to generate a power having a predetermined voltage and output the power;

an ammeter that measures the total value of the currents flowing through the plurality of heaters in the divided region according to the power output from the voltage controller and notifies the controller of information on the total value of currents; and a switch configured to output, to the current controller or the ammeter, the power output from the voltage controller.

10. The temperature controlling apparatus of claim 9, wherein the first controller is further configured to:

control the voltage controller to generate the power having the predetermined voltage;

control the switch to output the power from the voltage controller to the ammeter, for each of the plurality of divided regions at a predetermined timing;

control the ammeter to measure the total value of the currents flowing through the plurality of heaters in the divided region; and control the switch in each of the plurality of control blocks to output the power from the voltage controller to the current controller when measurement of the total value of the currents by the ammeter has been completed for the plurality of divided regions.

11. The temperature controlling apparatus of claim 9, wherein the first controller and the plurality of control blocks are provided on at one control board.

12. The temperature controlling apparatus of claim 1, wherein the first controller and the plurality of control blocks are provided on at least one control board.

13. The temperature controlling apparatus according to claim 1, wherein the first controller is connected to a second controller which is a controller for a processing apparatus, and the first controller is configured to notify the second controller in response to a determination that the part of the plurality of heaters is disconnected.

14. The temperature controlling apparatus according to claim 1, wherein the plurality of heaters of each divided region comprise at least first and second heaters on opposite sides of one or more insulating layers.

15. The temperature controlling apparatus according to claim 1, wherein each of the control blocks further includes an ammeter.

16. A temperature controlling method for controlling a temperature of a processing target substrate placed on a placing table, the method comprising:

measuring a total value of currents flowing through a plurality of heaters embedded inside the placing table in each of a plurality of divided regions obtained by dividing a top surface of the placing table and connected to each other in parallel, for each of the plurality of divided regions;

providing a plurality of control blocks, wherein the plurality of control blocks include a control block for each of the plurality of divided regions, and each control block includes a current controller;

determining, for each of the plurality of divided regions, whether a part of the plurality of heaters embedded in divided region is disconnected based on the total value of the currents flowing through the plurality of heaters embedded in the divided region; and in response to a determination, for each of the plurality of divided regions, that a part of the plurality of heaters embedded in the divided region is disconnected, controlling a disconnection current flowing through each heater embedded in the divided region where the part of the plurality of heaters is disconnected to become larger than a normal current flowing through each heater embedded in the divided region when none of the plurality of heaters is disconnected.

\* \* \* \* \*

UNITED STATES PATENT AND TRADEMARK OFFICE
CERTIFICATE OF CORRECTION

PATENT NO.      : 10,923,369 B2
APPLICATION NO. : 15/718229
DATED           : February 16, 2021
INVENTOR(S)     : Koizumi et al.

Page 1 of 1

It is certified that error appears in the above-identified patent and that said Letters Patent is hereby corrected as shown below:

In the Claims

Column 14, Claim 16, Line 66, "embedded in" should read -- embedded in a --.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*